United States Patent [19]
Goto et al.

[11] Patent Number: 5,622,559
[45] Date of Patent: Apr. 22, 1997

[54] METHOD OF PREPARING COMPOUND SEMICONDUCTOR

[75] Inventors: Hideki Goto, Tsuchiura; Katsushi Fujii, Ibaraki; Kenji Shimoyama, Tsuchiura, all of Japan

[73] Assignee: Mitsubishi Chemical Corporation, Tokyo, Japan

[21] Appl. No.: 69,728

[22] Filed: Jun. 1, 1993

[30] Foreign Application Priority Data

Jun. 2, 1992 [JP] Japan .................................. 4-141806

[51] Int. Cl.$^6$ .................................................. C30B 25/00
[52] U.S. Cl. ........................... 117/89; 117/104; 117/954
[58] Field of Search ............................. 158/610, 611, 158/613, 614, DIG. 70; 437/81, 133; 117/89, 104, 954

[56] References Cited

U.S. PATENT DOCUMENTS

| | | | |
|---|---|---|---|
| 4,916,089 | 4/1990 | Van Suchter et al | 156/611 |
| 5,178,718 | 1/1993 | DeKeijser et al. | 156/DIG. 70 |
| 5,250,148 | 10/1993 | Nishizawa et al. | 156/DIG. 70 |
| 5,270,247 | 12/1993 | Sakuma et al. | 437/133 |
| 5,296,088 | 3/1994 | Kodama | 437/81 |
| 5,300,185 | 4/1994 | Hori et al. | 437/81 |

FOREIGN PATENT DOCUMENTS

| | | |
|---|---|---|
| 61-232297 | 10/1986 | Japan . |
| 62-296415 | 12/1987 | Japan . |
| 04057319 | 2/1992 | Japan . |
| 2192198 | 1/1988 | United Kingdom . |

*Primary Examiner*—Robert Kunemund
*Attorney, Agent, or Firm*—Armstrong, Westerman, Hattori, McLeland & Naughton

[57] ABSTRACT

The vapor phase growth method of the group III–V compound semiconductor thin-film, using hydrides and organic metals containing no halogen elements as a raw material for the growth, is disclosed. The method is carried out by alternately introducing group III organic metals raw material gas as well as halides gas and/or halogens gas into a growth chamber, and also by repeating the introducing to grow a thin-film. In accordance with the present invention, it is possible to obtain such high-quality crystal growth as the planarization of hetero junction interface, the improvement of surface morphology or facet, and no deposit of polycrystals on the mask in a wide range.

11 Claims, 3 Drawing Sheets

5,622,559

METHOD OF PREPARING COMPOUND SEMICONDUCTOR

BACKGROUND OF THE INVENTION

1. Field of the Invention

The present invention relates to a method of forming a compound semiconductor layer, by a vapor phase growth of compound semiconductor thin-film using the hydrides and the organic metals as a raw material. In particular, the present invention relates to a method of preparing a compound semiconductor fitted for the planarization of the growth layer and the controlling of the deposit on a protective film used in a selective growth.

2. Description of the Related Art

For the purpose of improving the performance of a compound semiconductor device, a device using a two-dimensional gas or a quantum effect device has been energetically developed. It has been needed to control a growth speed precisely in the preparation of these devices, and a molecular-beam epitaxial growth (hereinafter referred to as MBE) method or a metal-organic vapor phase epitaxial growth (hereinafter refer to as MOVPE) method have been usually used. Actually, a steep hetero-junction interface has been formed in an atom-layer level by using these growth methods.

In case of the application of these structures to a device, a planarization of the hetero-junction interface will have a great influence on the characteristics of a device. For example, in a compound interface containing aluminum, a migration distance of the compound molecules containing aluminum is short, then the planarization will not be well effected. This poses such a problem that an electron mobility in the interface will be deteriorated. Recently, a selective growth method has been employed so as to more optimize a device structure. The merits of the selective growth method are that a high-quality selective growth region can be obtained and also a high-performance device can be obtained, as a damageless and comparatively low-temperature process can be realized thereby. In general, the selective growth has been carried out by MOVPE method, because it has been very difficult by MBE method.

However, in a process of the selective growth, there will arise many difficulties in the growth condition, the mixed-crystal ratio, the mask width and so on, in order not to deposit any polycrystals on a protective film. Especially in case of the compound containing aluminum, the more the mixed-crystal ratio of aluminum is raised and the higher the mask width is, the more polycrystals will be deposited on a protective film, thereby bringing about a problem that a desired device structure can not be obtained.

SUMMARY OF THE INVENTION

The present invention seeks to solve the above-mentioned problem. Accordingly, it is an object of the present invention to provide a method of preparing a compound semiconductor with an improved planarization of the growth surface and an excellent performance of the device.

In accordance with the present invention, the object can be accomplished by a method of preparing a semiconductor, whereby a vapor phase growth of the group III–V compound semiconductor thin-film is effected using both the hydrides and the organic metals containing no halogen elements as a raw material of the growth, which comprises alternately introducing (A) group III organic-metals gas and (B) halides gas and/or halogens gas into a growth chamber and repeating said introducing to grow a thin-film.

The present invention will be explained in detail below. As a raw material of the compound semiconductor employed in the present invention, conventional hydrides and organic metals containing no halogen elements are cited. As such hydrides, arsine ($AsH_3$), phosphine ($PH_3$), and the like are preferably used, and as such organic metals, trimethyl gallium (TMG), triethyl gallium (TEG), trimethyl aluminum (TMA), trimethyl indium (TMI), and the like are preferably used.

According to the present invention, it is characterized in that the thin-film will be grown by alternately introducing (A) group III organic metals gas and (B) halides and/or halogens gas into the growth chamber, in case of the vapor phase crystal growth of the thin-film of group III–V compound semiconductor using hydrides and organic metals which contain no halogen elements as a raw material for the crystal growth, thus making it possible to planarize the crystal growth surface and to stop the growth of polycrystals on a protective film.

As above-stated, the raw material containing no halogen elements should be used in the present invention. This is resulted from the reason that the usage of such halides as gallium chloride (GaCl), diethyl gallium chloride (($C_2H_5)_2$GaCl), arsenic trichloride ($AsCl_3$), as group III or group V raw material will cause the crystal growth mechanism to be complicated, and cause the precise control of the growth speed to be hard. Also, this is resulted from the reason that a quartz tube will be eroded in case where a compound containing aluminum is allowed to be grown.

In addition, it is preferable that mother elements included in the compound to be grown should not be contained in the halides and/or the halogens gas used in the present invention. As the halogens, $Cl_2$, $I_2$, $F_2$, and $Br_2$ are practically used. As halides gas, hydrogen halide gas and sulfur halide gas are preferably used, and HBr, HI, HF, HCl, $CCl_2F_2$, $SF_5$, $CH_3Cl$, $CCl_4$, and the mixture thereof are practically used. Above all, HCl is most preferable.

The amount of the halides gas and/or the halogens gas may be less than that in the case where the usual etching of the semiconductor thin-film surface is conducted, and may not be especially restricted. This may be set up by the one skilled in the art, taking the size and the temperature of the growth chamber, and the like into consideration. The total pressure of gas to be introduced is preferably set up at normal pressure or less. Also as to the growth temperature, it is no problem to select the same condition with that employed in the normal vapor phase growth method, and then 500°–800° C. is usually selected, and around 600°–800° C. is preferably selected.

In the present invention, the group III organic metals raw material gas or the halides and/or the halogen gas will be alternately introduced into a growth chamber. The continuation-time for once supply of the group III organic metals raw material gas is preferably one minute or less, and is more preferably 30 seconds or less. In case the continuation-time exceeds more than one minute, such performance of the present invention as the planarization of a crystal growth surface will not be attained. After the supply of group III organic metals raw material gas is stopped, the halides gas and/or the halogens gas will be supplied. The supplying time of them is also preferably one minute or less, and most preferably is 30 seconds or less.

The non-flowing time of the above two kinds of gases, when they are exchanged, is not especially limited, the longer time will cause the operation to be lowered in the productivity. Then, it is preferable that the time is 10 seconds or less, and it is more preferable that the time is kept for 1–10 seconds in order that group III organic metals raw material gas and halides and/or halogens gas will not be mixed on the growth surface.

The present invention is applicable to a conventional thin-film growth of the group III–V compound semiconductor, and particularly this is applicable to a thin-film growth of the group III–V compound semiconductor containing aluminum. As a raw material gas containing aluminum, all kinds of well known materials can be used. But trialkyl aluminum is preferable, owing to the reason that it gives comparatively simple reaction, the behavior of the gas generated after its decomposition is distinct, and it is fairly cheap. Also in this case, as halides gas and/or the halogens gas, HCl is preferably used.

As the kind of dopant in case where the thin-film of the group III–V compound semiconductor obtained according to the present invention is doped, various well known ones can be employed. Among them, the dopant which enters the group III site will enable the present invention to be effective, and this will be prominently realized when silicon or zinc is doped, especially when silicon or zinc is doped in the thin-film of the group III–V compound semiconductor containing aluminum.

As mentioned above, in accordance with the present invention, in a vapor phase crystal growth method of the group III–V compound semiconductor thin-film using the hydrides and the organic metals containing no halogen elements as a raw material for the growth, by introducing (A) group III organic metal raw material gas and (B) halides and/or halogen gas, which contain no mother elements of the compound to be grown, at least one time alternately into a growth chamber, the following can be achieved. 1) The growth can be effected by almost equal growth condition to that of a conventional MOVPE method, and then it is possible to planarize the hetero junction interface, and to improve the planarization of a surface morphology and a facet surface. 2) The high quality crystal growth on a mask can be obtained without the deposit of polycrystal in a wide range. 3) The growth speed can keep the same reproducibility and control as those of a conventional MOVPE, though several % of the speed is lowered by addition of a trace amount of HCl, and it can be said that this is an effective method in a practical use.

BRIEF DESCRIPTION OF DRAWING

The objects, features, and advantages of the present invention will become more apparent, from the following description of the preferred embodiments taken in conjunction with the accompanying drawings, in which.

DETAILED DESCRIPTION OF THE PREFERRED EMBODIMENT

The present invention will be explained in more detail, by reference to the following Examples in connection with the drawings. The present invention is be no means limited to the Examples, without departing from the spirit and the scope thereof.

Figure 1:
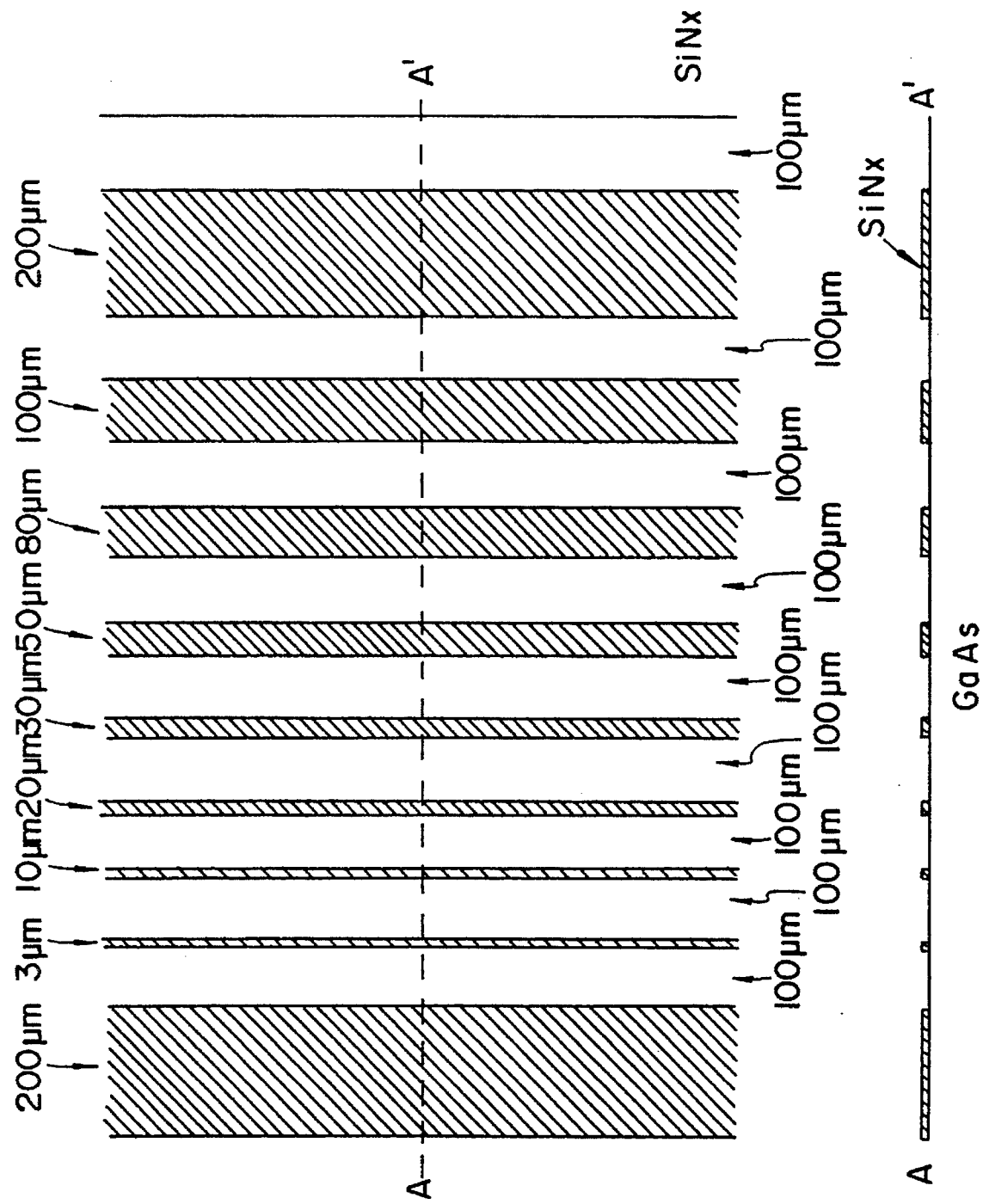
FIG. 1 shows an explanation diagram of the stripe pattern of $SiN_x$ film used in Example and Comparative Examples 1,2.
Figure 2:
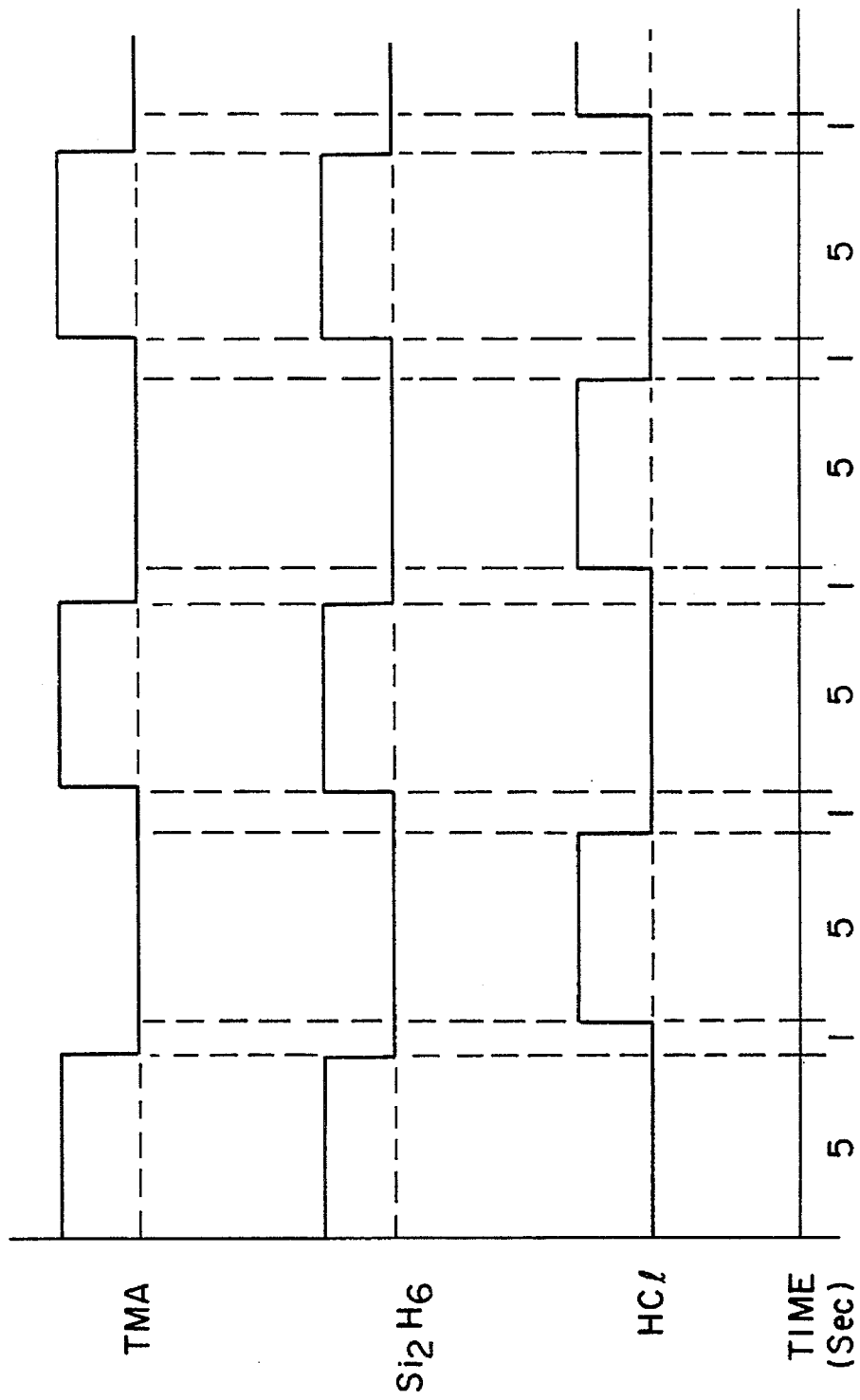
FIG. 2 shows a gas-flow program used in Examples.

EXAMPLE $SiN_x$ film was deposited on a GaAs substrate in 100 nm thick by a CVD plasma method. Then, GaAs was partially exposed by using a photo-lithography. The distance between the exposed GaAs and the next exposed GaAs was changed from 2μ to 1 mm, the stripe patterns of which are shown in FIG. 1. On this substrate was grown AlAs doped with Si, using a gas-flow program as shown in FIG. 2. TMA (trimethyl aluminum) as the group III organic metal raw material gas, arsine ($AsH_3$) as the group V raw material gas, and HCl as the halide gas were used respectively. At this time, the growth temperature was 700° C., the growth pressure was 0.1 atm. and the ratio of HCl and TMA was equal in mole concentration. Also, the growth speed of AlAs, in case $SiN_x$ film was not covered, was 1μm/hr.

First of all, TMA was introduced in an atmosphere of arsine and $H_2$ of a carrier gas for five minutes. Then, HCl was introduced for five minutes after an interval of one second, and further one second interval was passed by. Assuming that all this time was one period, turned back to the process in which the first TMS was again introduced for five minutes. In this way, the gas-flow program shown in FIG. 2 was carried out, and 180 periods were repeated. During these periods, arsine and $H_2$, a carrier gas, were always continued to flow, and disilane ($SiH_6$), a doping source of Si, was supplied synchronously along with TMA, in an amount of $1\times10^{16}/cm^3$ which was equivalent to the doping ratio.

As a result, a few cores of AlAs were noticed to be formed on the $SiN_x$ film of more than 500 μm wide, but the core was not noticed at all on the $SiN_x$ film of less than 500 μm wide. AlAs was selectively grown only on the exposed GaAs, and further the carrier concentration of the grown AlAs was measured to be $9\times10^{17}/cm^3$.

Comparative Example 1

Figure 3:
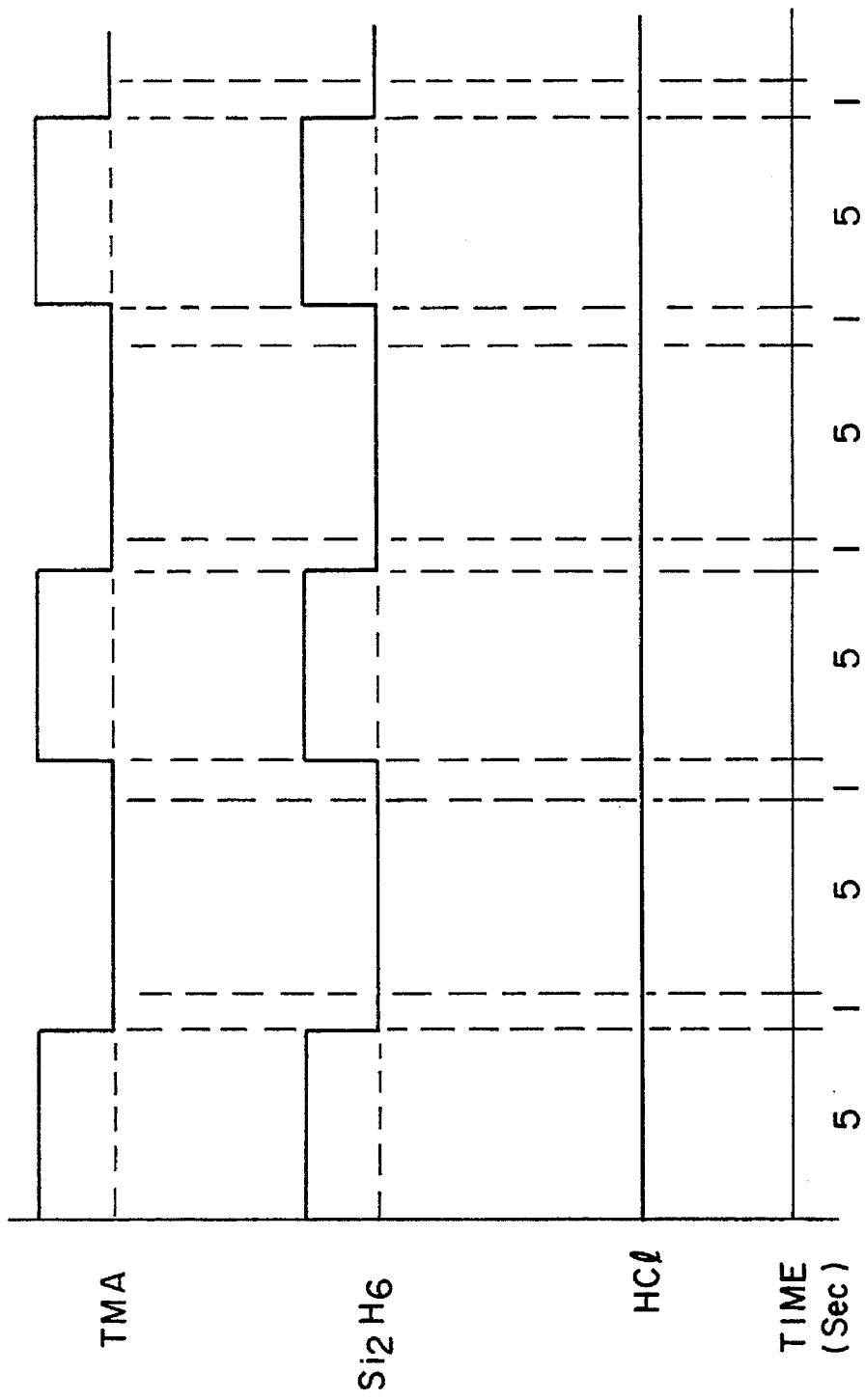
FIG. 3 shows a gas-flow program used in Comparative Example 1.

AlAs was grown according to the technique of Example, excepting that the gas-flow program as shown in FIG. 3, in which HCl was not supplied, was used. The result was that the growth of AlAs polycrystal was noticed on almost all the surface of all the $SiN_x$ films.

Comparative Example 2

AlAs was grown according to the technique of Example, excepting that TMA, disilane, arsine, and HCl were continuously supplied in an atmosphere of $H_2$ without the alternate supply thereof. As a result, as to the selective growth, in the same way as mentioned in Example, very few cores of AlAs were found to be formed on the $SiN_x$ film of more than 500 μm wide, and the cores were not found at all on the $SiN_x$ of less than 500 μm wide. AlAs was selectively grown only on the exposed GaAs. The carrier concentration of the grown AlAs, however, was measured to be $1\times10^{16}/cm^3$ or less.

What is claimed is:

1. A vapor phase growth method of a group III–V compound semiconductor thin-film, comprising reacting a group III compound and a group V compound and depositing the reacted compounds on a substrate, wherein (A) group III organic metals raw material gas having no halogen atoms is alternately introduced for (B) halide gas and/or halogen gas into a growth chamber, and group V hydride gas is introduced into said growth chamber during periods in which said group III organic metals raw material gas is introduced.

2. A vapor phase growth method of the compound semiconductor according to claim 1, wherein the growth method is a selective growth method.

3. A vapor phase growth method of the compound semiconductor according to claim 1, wherein each alternate supplying time of the raw material for growth is one minute or less.

4. A vapor phase growth method of the compound semiconductor according to claim 1, wherein the halides gas is at least one member selected from the group consisting of HBr, HI, HCl, HF, $CCl_2$, $F_2$, $SF_6$, $CH_3Cl$ and $CCl_4$.

5. A vapor phase growth method of the compound semiconductor according to claim 1, wherein the halides gas is HCl.

6. A vapor phase growth method of the compound semiconductor according to claim 1, wherein the group III–V compound semiconductor contains aluminum.

7. A group III–V compound semiconductor obtained by the method of claim 1.

8. A vapor phase growth method of the compound semiconductor according to claim 1, wherein group V raw material is continuously introduced throughout the growth of the thin-film.

9. A vapor phase growth method of the compound semiconductor according to claim 1, wherein group V raw material is introduced when said halides gas and/or halogens gas is introduced into the growth chamber.

10. A vapor phase growth method of the compound semiconductor according to claim 1, wherein the growth temperature is 600°–800° C.

11. A vapor phase growth method of the compound semiconductor according to claim 1, wherein the growth temperature is between 500° C. to 800° C.

* * * * *